(12) United States Patent
Yang et al.

(10) Patent No.: US 9,269,758 B2
(45) Date of Patent: Feb. 23, 2016

(54) LOW TCR HIGH RESISTANCE RESISTOR

(75) Inventors: Jing-Hwang Yang, Zhubei (TW); Chun-Heng Liao, Xindian (TW); Hsin-Li Cheng, Hsin Chu (TW); Liang-Kai Han, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 279 days.

(21) Appl. No.: 13/005,681

(22) Filed: Jan. 13, 2011

(65) Prior Publication Data
US 2012/0181612 A1    Jul. 19, 2012

(51) Int. Cl.
*H01L 29/40*   (2006.01)
*H01L 49/02*   (2006.01)
*H01L 27/06*   (2006.01)
*H01L 27/08*   (2006.01)

(52) U.S. Cl.
CPC .......... *H01L 28/20* (2013.01); *H01L 27/0629* (2013.01); *H01L 27/0802* (2013.01)

(58) Field of Classification Search
CPC ............................ H01L 28/20; H01L 27/0629
See application file for complete search history.

(56) References Cited

U.S. PATENT DOCUMENTS

| 2007/0045695 A1* | 3/2007 | Takeoka et al. | 257/296 |
| 2009/0309163 A1* | 12/2009 | Wang et al. | 257/369 |
| 2010/0291743 A1* | 11/2010 | Nishi et al. | 438/268 |

* cited by examiner

*Primary Examiner* — Long Pham
(74) *Attorney, Agent, or Firm* — Haynes and Boone, LLP

(57) ABSTRACT

The present disclosure involves a method. The method includes providing a substrate including a top surface. The method also includes forming a gate over the top surface of the substrate. The formed gate has a first height measured from the top surface of the substrate. The method also includes etching the gate to reduce the gate to a second height. This second height is substantially less than the first height. The present disclosure also involves a semiconductor device. The semiconductor device includes a substrate. The substrate includes a top surface. The semiconductor device also includes a first gate formed over the top surface of the substrate. The first gate has a first height. The semiconductor device also includes a second gate formed over the top surface of the substrate. The second gate has a second height. The first height is substantially less than the second height.

12 Claims, 11 Drawing Sheets

|  | Poly Thickness (A) | Energy (KeV) | BF$_2$ Dose (x10$^{14}$ ions/cm$^2$) | Rs (ohm/SQ) | TCR (ppm/°C) |
|---|---|---|---|---|---|
| 294 | 2000 | 20 | 9.4 | 1079 | -926.5 |
| 293 | 1500 | 20 | 12 | 929.5 | -682 |
| 292 | 1000 | 20 | 17 | 1013 | -413 |
| 291 | 500 | 30 | 30 | 1671 | -74.7 |

Fig. 10B

LOW TCR HIGH RESISTANCE RESISTOR

BACKGROUND

The semiconductor integrated circuit (IC) industry has experienced rapid growth in recent years. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Semiconductor resistors may be formed on ICs. It is desirable for such resistors to have a low temperature coefficient of resistance (TCR) while also having a high resistance. Traditionally, methods for reducing TCR while maintaining high resistance involved extra film deposition (either polysilicon or SiCR), extra masks, and/or higher costs. In addition, these processes were complicated and sometimes resulted in residue or damage to the device.

Therefore, while existing methods of fabricating semiconductor resistors have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 10B is a table providing implantation parameters for the different data points in FIG. 10A.

DETAILED DESCRIPTION

Figure 1:
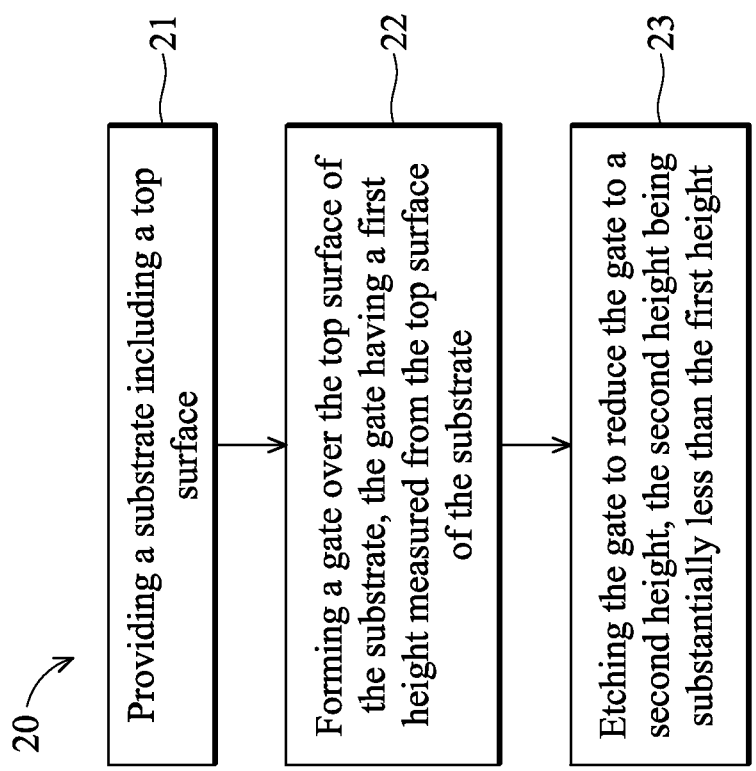
FIG. 1 is a flowchart illustrating a method for fabricating a semiconductor device according to various aspects of the present disclosure.
Figure 2:
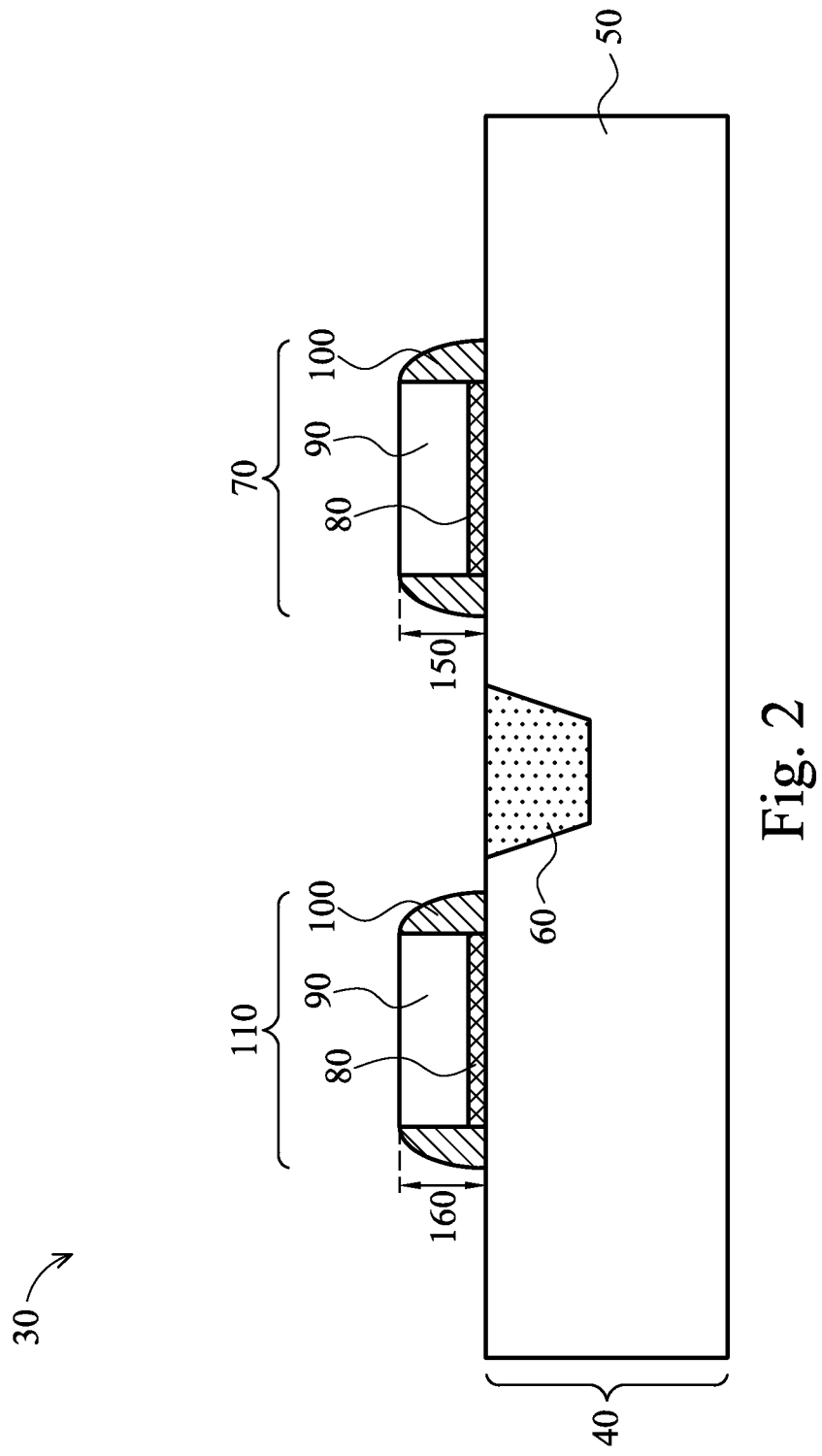
FIGS. 2-8 are diagrammatic fragmentary cross-sectional side views of a portion of a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 20 for fabricating a semiconductor device according to various aspects of the present disclosure. Referring to FIG. 1, the method 20 begins with block 21 in which a substrate including a top surface is provided. The method 20 continues with block 22 in which a gate is formed over the top surface of the substrate. The formed gate has a first height measured from the top surface of the substrate. The method 20 continues with block 23 in which the gate is etched to reduce it to a second height. This second height is substantially less than the first height. The processes performed by blocks 21, 22 and 23 result in the formation of a gate that is substantially thinner than other gates formed on the substrate that were not subjected to the etching of block 23.

FIGS. 2-8 are diagrammatic fragmentary cross-sectional side views of a portion of a semiconductor device according to various aspects of the present disclosure. Referring FIG. 2, a semiconductor device 30 including a substrate 40 is shown. An active region 50 is formed in the substrate 40 using one or more ion implantation processes known in the art. In certain embodiments, the active region 50 is formed when the substrate 40 is doped with a P-type dopant such as boron. In other embodiments, an N-type dopant such as arsenic or phosphorous is used. In certain embodiments, doped wells are also formed in the active region 50 using one or more implantation processes. For the sake of simplicity and clarity, these doped wells are not specifically illustrated herein. Isolation structures such as shallow trench isolation (STI) device 60 are also formed in the substrate 40. The STI device 60 includes a dielectric material, which may be silicon oxide or silicon nitride. The STI device 60 is formed by etching a trench in the substrate 40 and thereafter filling the trench with the dielectric material.

A gate 70 is formed over the substrate 40. The gate 70 includes a gate dielectric layer 80 and a gate electrode layer 90 that is formed over the gate dielectric layer. The gate dielectric layer 80 includes an oxide material. The gate electrode layer 90 includes a polysilicon material. Gate spacers 100 are also formed on the side walls of the gate 70. In certain embodiments, the gate 70 functions as a resistor.

A gate 110 is also formed over the substrate. The gate 110 includes a gate dielectric layer 80 and a gate electrode layer 90 that is formed over the gate dielectric layer. In certain embodiments, the gate dielectric layer 80 includes an oxide material. In other embodiments, the gate dielectric layer 80 includes a high-k dielectric material. The high-k material can be defined as a dielectric material having its dielectric constant greater than about 3.9, that of a thermal silicon oxide. For example, the high-k dielectric material may include hafnium oxide ($HfO_2$), which has a dielectric constant that is in a range from approximately 18 to approximately 40. Alternatively, the high-k material may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. In certain embodiments, the gate electrode layer 90 includes a polysilicon material. In other embodiments, the gate electrode layer 90 includes a metal material such as tungsten, aluminum, copper, or combinations thereof. Gate spacers 100 are formed on the side walls of the gate 110.

The gate 70 has a height 150 measured from the top surface of the substrate 40. The gate 110 has a height 160 measured from the top surface of the substrate 40. In the depicted embodiment, the heights 150 and 160 are substantially the same. In certain embodiments, the gate 70 and the gate 110 are formed simultaneously.

Figure 3:
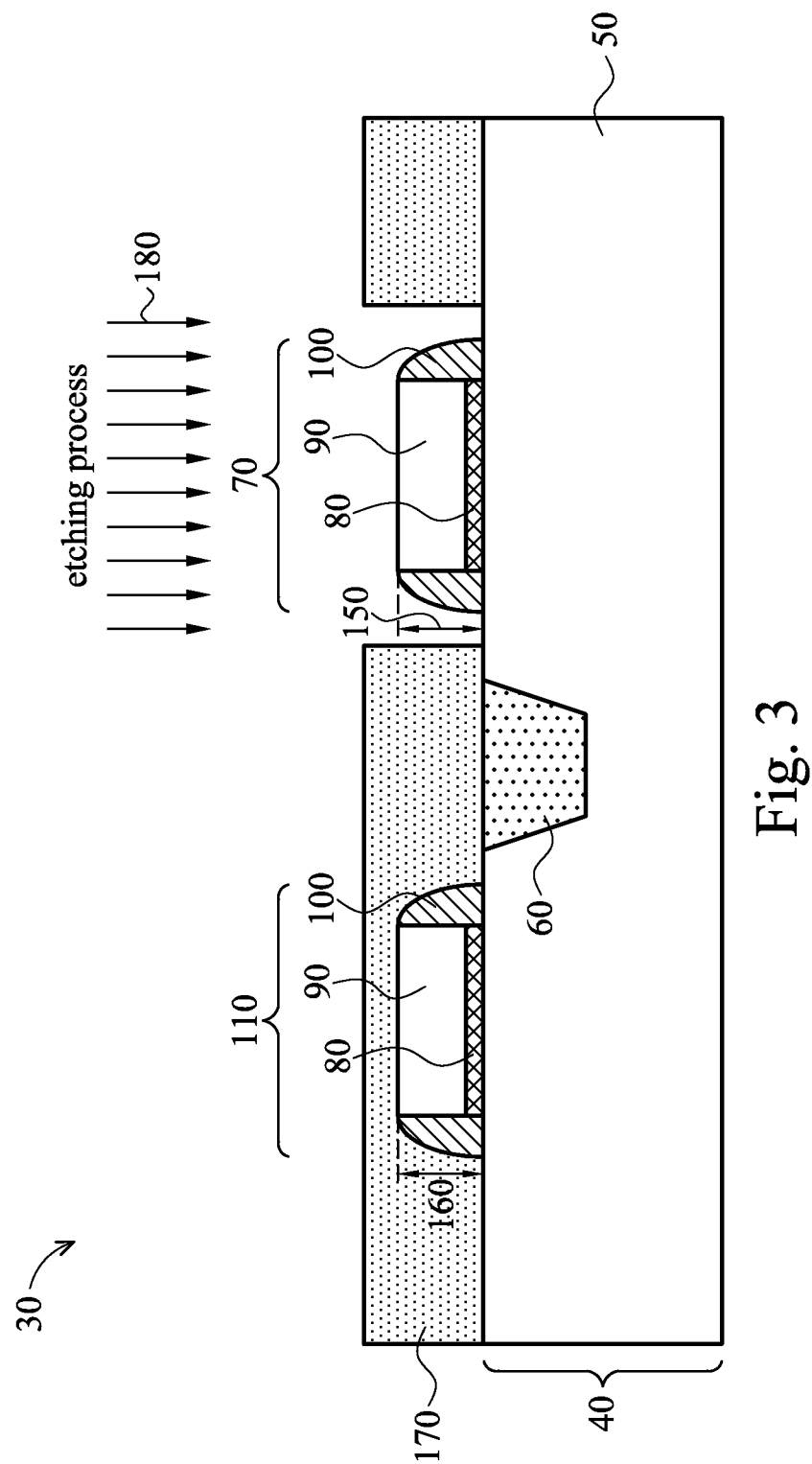

Referring to FIG. 3, a patterned photoresist layer 170 is formed over the substrate 40. In the depicted embodiment, the photoresist layer 170 protects or covers the gate 110 and leaves the gate 70 exposed. An etching process 180 is then performed to remove material from the gate electrode 90 and the gate spacers 100 of the gate 70, which are not protected by the photoresist layer 170. In certain embodiments, the etching process 180 is a dry etching process. In some embodiments, the height of the gate electrode 90 after the etching process 180 is substantially the same as the height of the gate spacers 100. In other embodiments, the height of the gate electrode 90 differs from the height of the gate spacers 100 after the etching process 180. In certain embodiments, the etchant used in the etching process 180 is selected from a group including $HBr$, $CL_2$, $CF_4$, and $HeO_2$.

Figure 4:
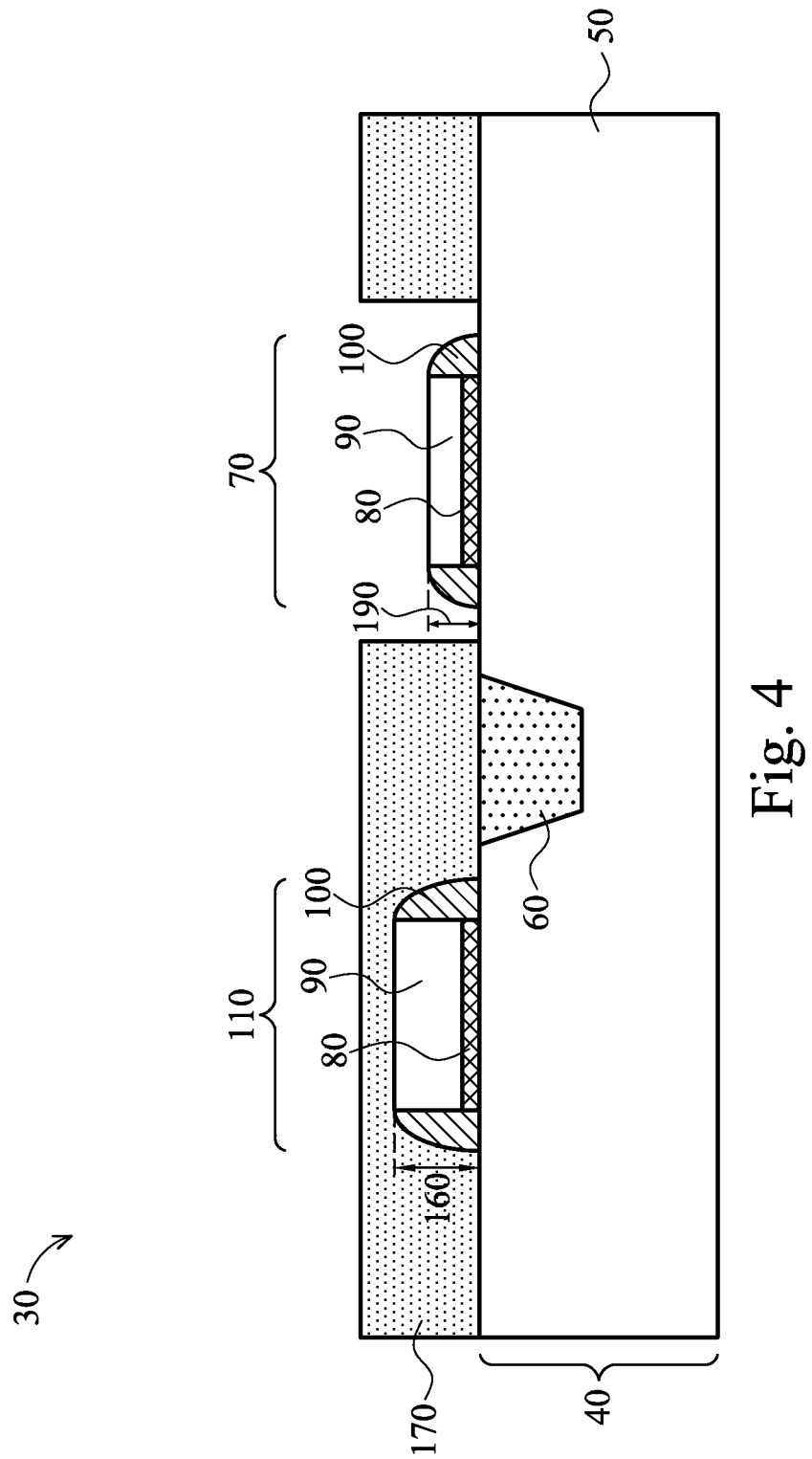

Referring now to FIG. 4, the semiconductor device 30 is shown after the etching process 180 is completed. The etching process 180 has removed material from the gate 70 to reduce it to a height 190. The height 190 of the gate 70 is substantially less than its previous height 150 and the height 160 of the gate 110. In certain embodiments, the height 190 differs from the previous height 150 by between 500 angstroms (Å) and 2000 Å, for example the height 190 is less than the height 150. In certain embodiments, the height 190 is about 10% to about 75% of the height 160, for example by about 50%. In an embodiment, the height 190 is at least 25% shorter than the height 150.

Figure 5:
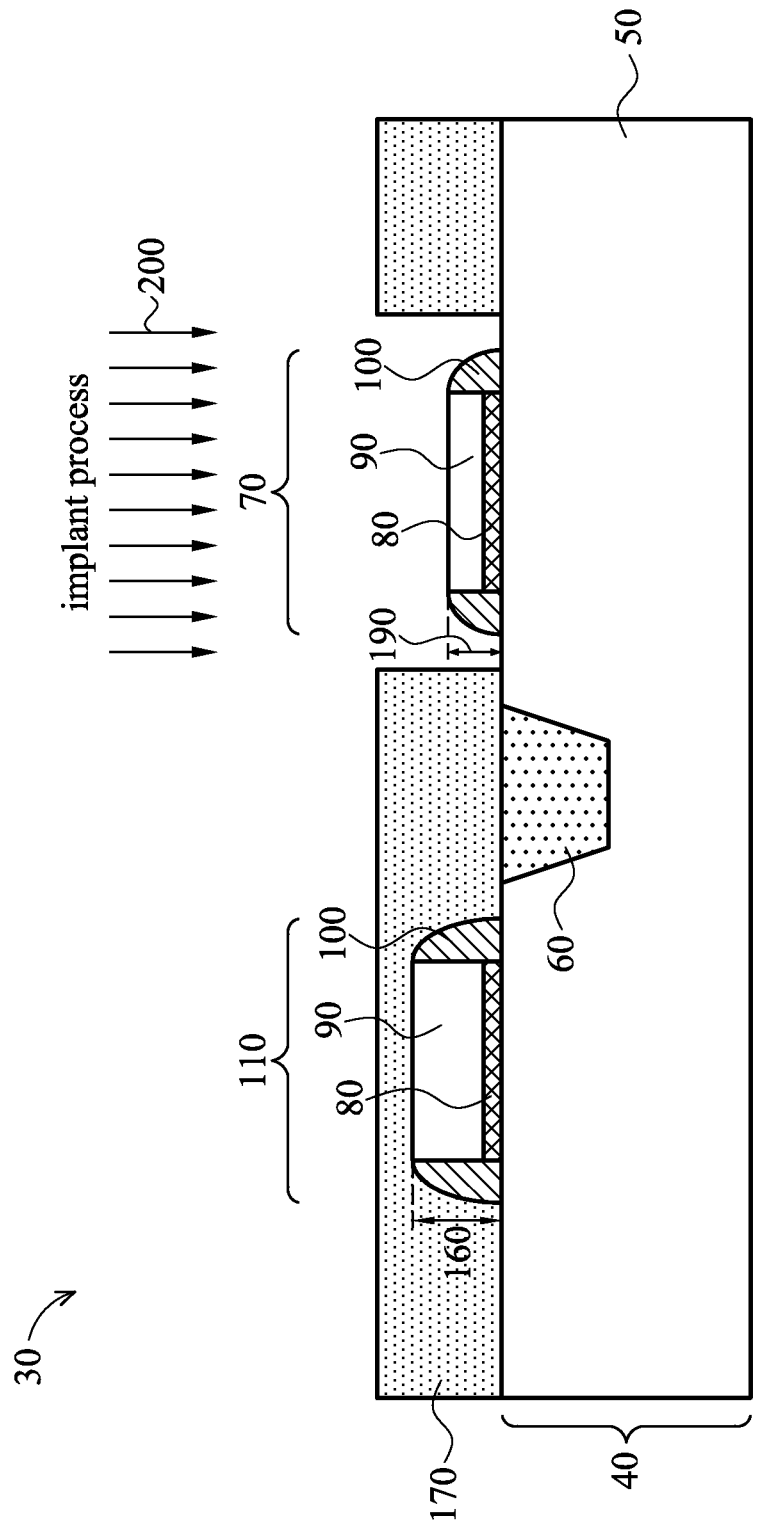

Referring now to FIG. 5, an implant process 200 is applied to the semiconductor device 30. The implant process 200 includes one or more of the ion implantation processes known in the art. The implant process 200 acts on areas not protected by the photoresist layer 170, such as the gate electrode 90 and the gate spacers 100 of the gate 70. In certain embodiments, the implant process 200 uses $BF_2$ as a dopant. In some embodiments, the implant process 200 has an implantation energy level between about 10 KeV and about 40 KeV and a dosage between dosage between about $9 \times 10^{14}$ ions/cm$^2$ and about $4 \times 10^{15}$ ions/cm$^2$. The doping species, energy, and dose of the implant process 200 can be adjusted according to the desired sheet resistance and the height 190 of the gate 70.

The implant process 200 raises the sheet resistance of the gate 70 and therefore may be referred to as a high resistance implant (HRI). In certain embodiments, before the implant process 200 the sheet resistance is between about 10 Kohm/cm$^2$ and about 200 Kohm/cm$^2$. The sheet resistance of the gate 70 after the implant process 200 is between about 1 Kohm/cm$^2$ and about 5 Kohm/cm$^2$. In some embodiments, the implant process 200 is performed before the etching process 180. In other embodiments, the implant process 200 is performed after the etching process 180. In certain embodiments, the implant process 200 is performed in addition to any other implant processes performed on the semiconductor device 30, such as an implant process used to form the source and drain regions in the substrate. In other embodiments, the implant process 200 is part of other implant processes performed on the semiconductor device 30, such as the implant process used to form the source and drain regions (not illustrated herein) in the substrate.

This configuration of the etching process 180 and the implant process 200 is beneficial due to low cost. No additional photo mask is needed during the process and only one extra polysilicon etching step is added to existing processes. In addition, the process described is highly feasible using existing methods, as it is compatible with existing CMOS processes.

Figure 6:
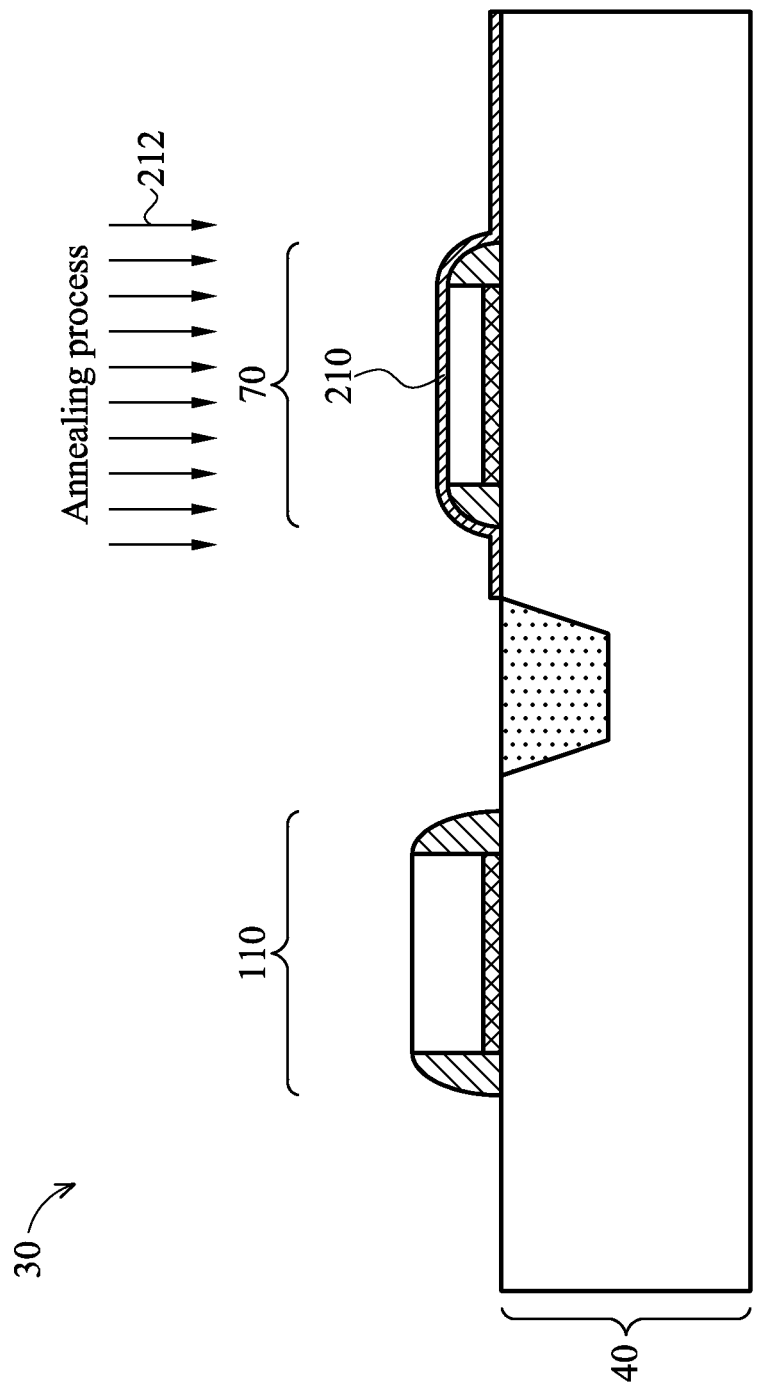

Referring now to FIG. 6, a resist protective oxide (RPO) layer 210 is formed over the gate 70 and portions of the surrounding surface of the substrate 40. The RPO layer 210 protects areas it covers during salicide formation, which is to be performed later. The RPO layer 210 is formed by depositing a dielectric layer over the surface of substrate 40, and then patterning the dielectric layer with a patterned photoresist. In the depicted embodiment, the RPO layer 210 covers the gate 70 but does not cover the gate 110. In certain embodiments, an annealing process 212 such as rapid thermal annealing (RTA) is applied to the gate 70 to activate the dopant from the implant process 200. In certain embodiments, the annealing process 212 is applied after forming the RPO layer 210. In other embodiments, the annealing process 212 is applied before forming the RPO layer 210.

The processes described, when applied to the gate 70, decrease a magnitude of variation of the temperature coefficient of resistance (TCR) of the gate. TCR is a measurement of the effect a change in temperature has on the resistance of a structure such as the gate 70. A TCR of greater than 0 indicates that the resistance of the structure increases as the structure's temperature is increased. A TCR of less than 0 indicates that the resistance of the structure decreases as the structure's temperature is increased. The magnitude of a TCR value is the distance of the value from 0. A resistance of a structure with a TCR closer to 0 will not vary as much with temperature changes as the resistance of a structure with a TCR further away from 0. In certain embodiments, the height 190 is chosen based on a desired TCR value for the gate 70.

The decrease in TCR magnitude of the gate 70 is due to the grain size of the gate electrode 90 being increased by the combination of the etching process 180, the implant process 200, and the annealing process 212. Generally, TCR is negative if the grain-boundary is dominated by thermionic emission, while TCR is positive if the polysilicon crystal grain is dominated by phonon scattering. After applying the described processes, the TCR of the gate electrode 90 is grain boundary dominated leading to negative TCR. The TCR of the gate electrode 90 gradually changes from grain-boundary dominated to phonon-scattering-dominated, leading to positive-trending or less negative TCR, due to larger grain size. Hence the magnitude of TCR of the gate electrode 90 is decreased. In some embodiments, the TCR after the etching process 180, the implant process 200, and the annealing process 212 are performed will be between about 150 parts per million per degree Celsius (ppm/° C.) and about −150 ppm/° C.

Figure 7:
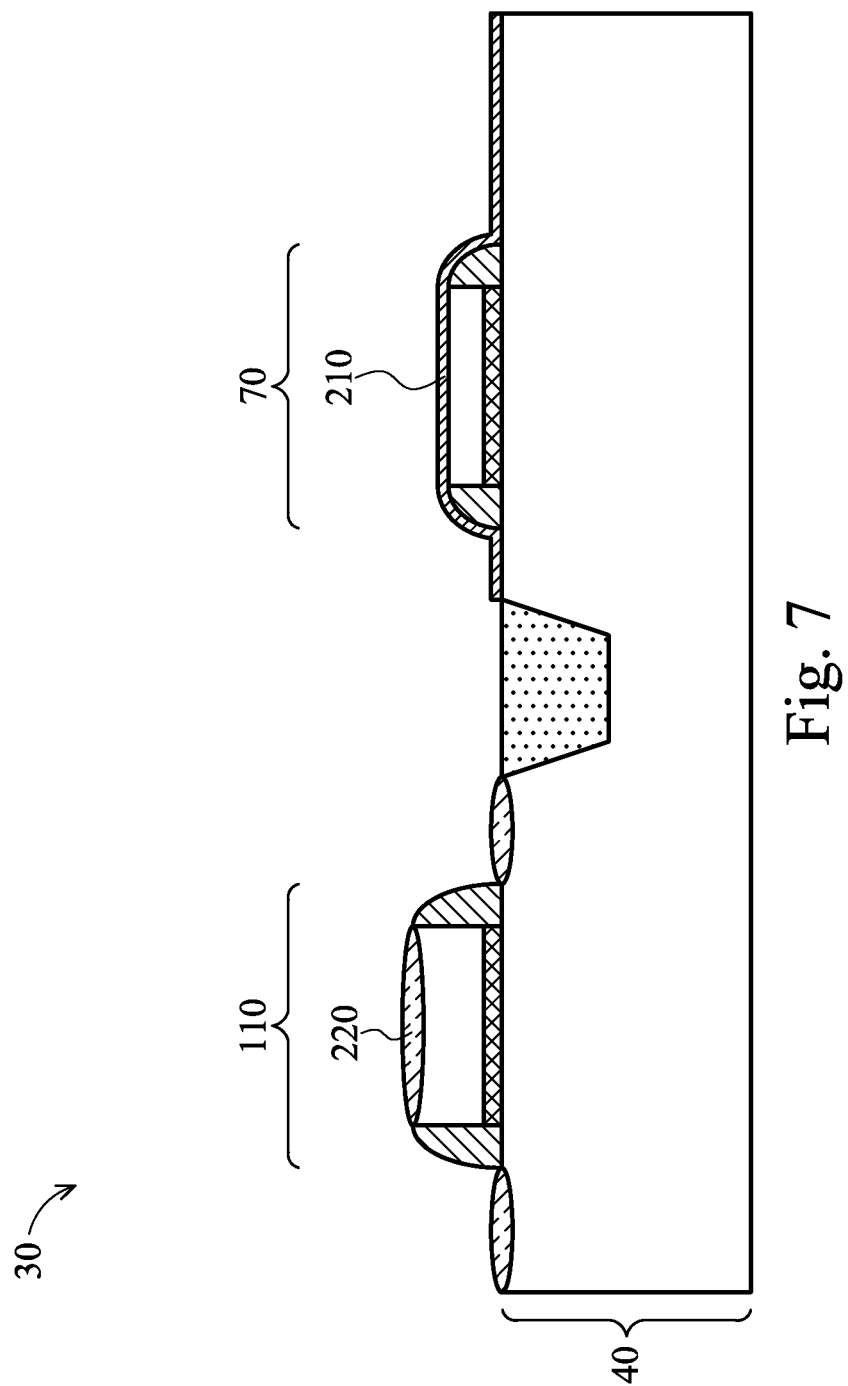

Referring now to FIG. 7, a silicide layer 220 is formed over the gate 110 and source and drain regions adjacent to the gate 110 in the substrate 40. In certain embodiments, the silicide layer 220 is formed with a salicide or self-aligned silicide process, which does not require a photolithographic patterning step. In such a process, a layer of a transition metal is deposited over the semiconductor device. In certain embodiments, this transition metal is selected from the group comprising titanium, cobalt, nickel, platinum, and tungsten. The semiconductor device is then annealed using a process such as rapid thermal annealing (RTA). The annealing causes the transition metal to react with silicon regions of the semiconductor device to form the silicide layer 220. The RPO layer 210 protects silicon components that need not be silicided. The annealing process will not cause a reaction between the RPO layer 210 and the transition metal. After the salicide process is complete, an etching process is performed to remove any remaining transition metal from the surface of the semiconductor device.

Figure 8:
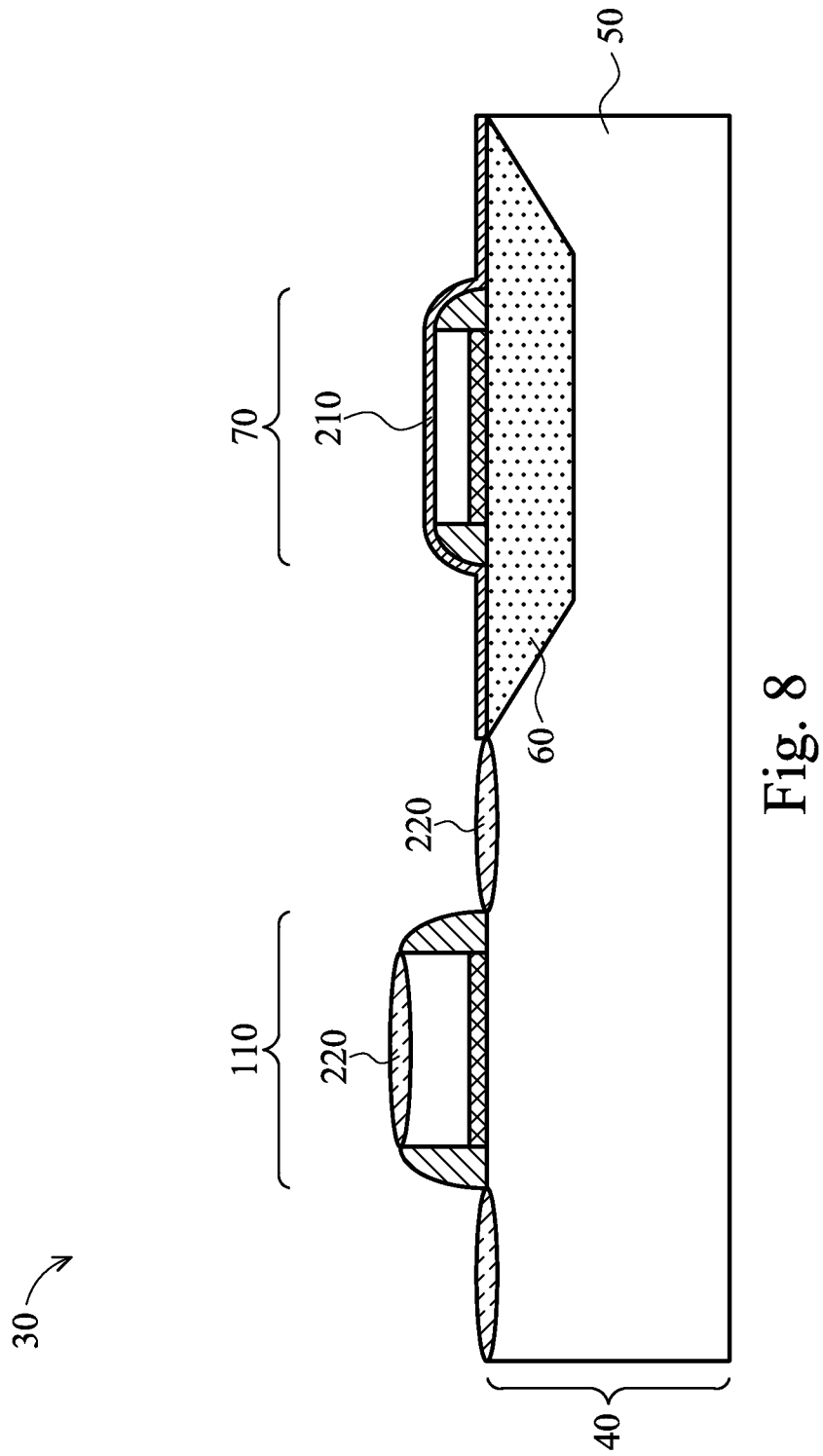

Referring now to FIG. 8, the gate 70 and the gate 110 are again shown according to an alternative embodiment. In the interest of simplicity and clarity, components that appear in the previous figures are referred to using the same reference numbers. In the depicted alternative embodiment, the gate 70 is formed over the STI device 60. In certain embodiments, the STI device 60 isolates the gate 70 from the rest of the semiconductor device 30. This improves the performance of the gate 70 in embodiments where the gate 70 functions as a resistor. The gate 110 is formed over the active region 50. Source/drain regions are formed in the substrate 50 on either side of the gate 110. The source/drain regions may include lightly doped source/drain regions and heavily doped source/drain regions. The lightly doped source/drain regions and the heavily doped source/drain regions may be formed by one or more ion implantation processes or diffusion processes known in the art, or combinations thereof. The source/drain regions and the gate 110 together form a transistor device. When the transistor is turned on and is in operation, conductive channels will be formed underneath the gate 110 and between the source/drain regions. For the sake of simplicity and clarity, these source and drain regions are not specifically illustrated herein.

In certain embodiments, the silicide layer 220 is formed over these source and drain regions and the gate 110 to improve conductivity. In the depicted embodiment, the height of the gate 70 as measured from the substrate 40 is less than the height of the gate 110 as measured from the substrate 40 by between about 10% and about 75%, for example by about 50%. In an embodiment, the height difference is at least 25%. The gate 70 has been thinned by an etching process, such as the one described previously with reference to FIG. 3, in order to lower its TCR. In addition, the gate 70 has been treated with an implant process, such as the HRI process described previously with reference to FIG. 5, in order to increase its sheet resistance. The sheet resistance of gate 70 is increased as compared to a standard N+ or P+ doped polysilicon with an RPO layer.

Figure 9:
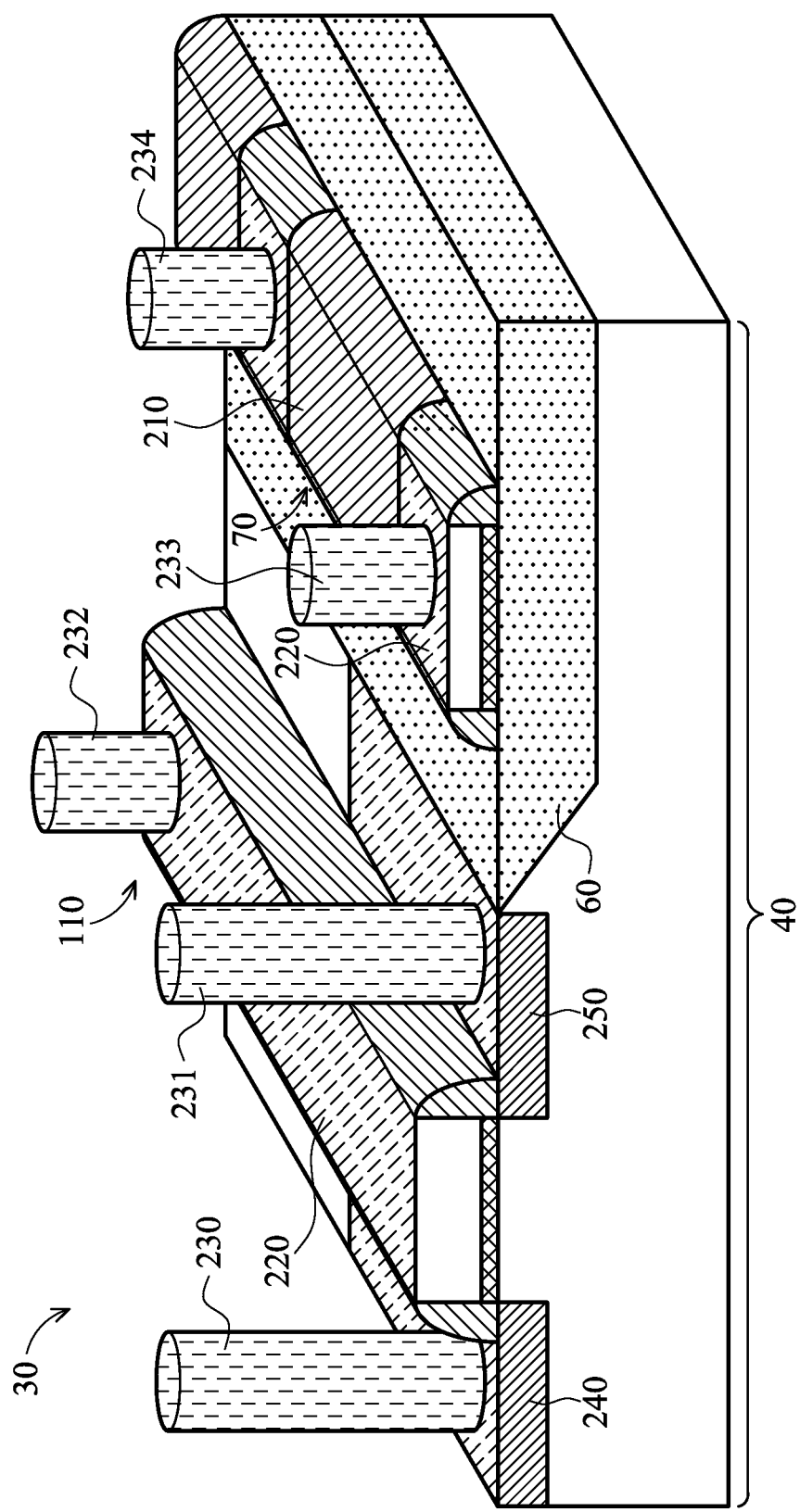
FIG. 9 is a perspective view of a portion of a semiconductor device according to various aspects of the present disclosure.

FIG. 9 is a perspective view of the alternative embodiment shown in FIG. 8. The gate 70 is formed over the STI device 60. The silicide layer 220 is formed over regions of the gate 70 and the gate 110. The silicide layer 220 is also formed over a source region 240 and a drain region 250 adjacent to the gate 110. Contacts 230 and 231 are also respectively formed over the source region 240 and the drain region 250 adjacent to the gate 110. In addition, a contact 232 is formed over the salicide layer of the gate 110. Contacts 233 and 234 are also formed over the silicide layer 220 of the gate 70. In certain embodiments, the contacts 230, 231, 232, 233 and 234 include tungsten aluminum. In certain embodiments, the gate 70 includes a different number of gate contacts than the gate 110. For example, in the depicted embodiment, the gate 110 has a single contact 232, while the gate 70 has two contacts 233 and 234. In certain embodiments, this difference in the number of contacts is due to the gate 70 being a resistor and the gate 110 being a functional gate. For example, to apply a voltage to a functional gate of a transistor device, only one contact may be needed. However, two contacts may be needed to apply a voltage across a resistor. In other embodiments, such as a configuration where the gate 70 is arranged in series with other resistors, the gate 70 may include a single contact.

Figure 10A:
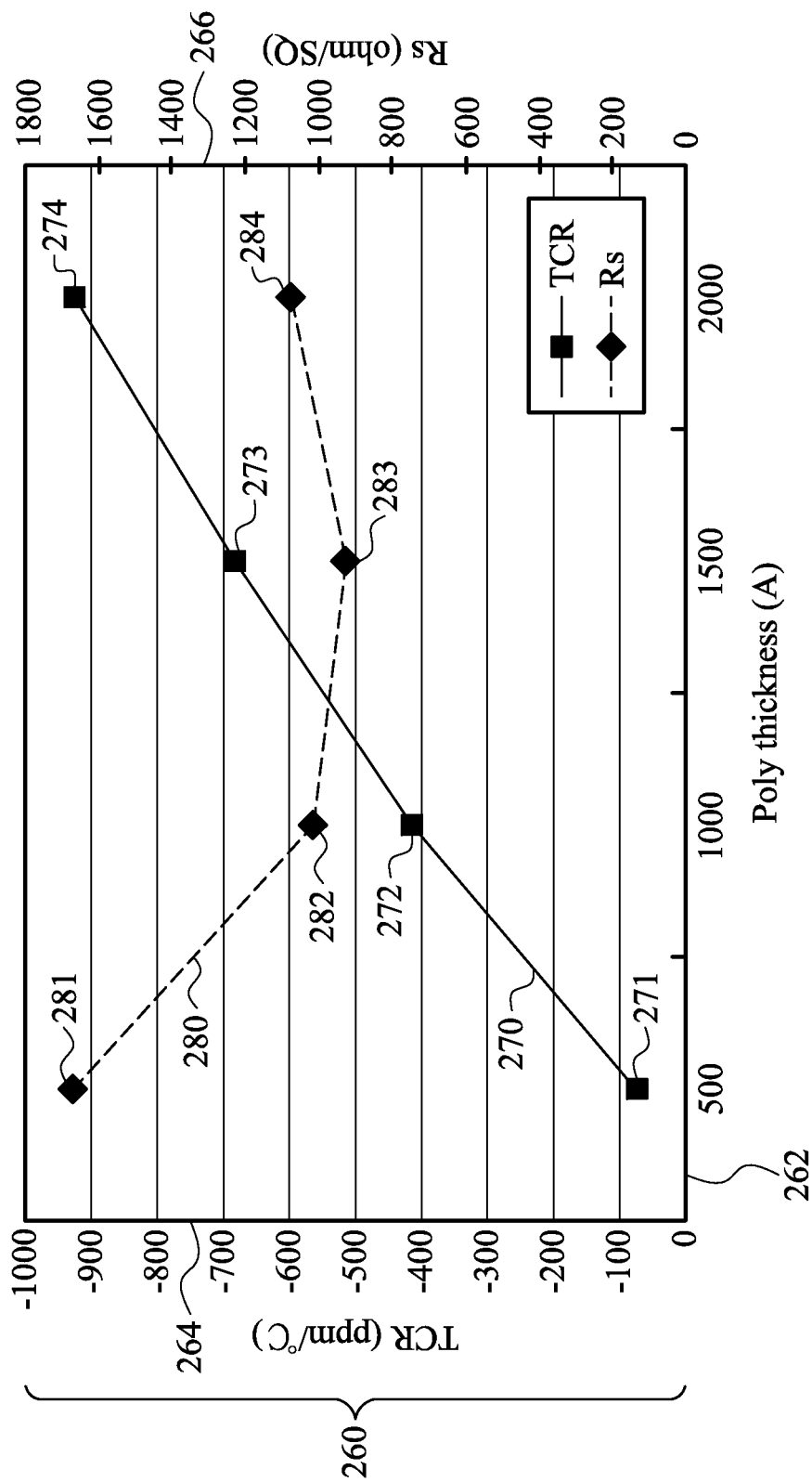
FIG. 10A is a two-axis line graph plotting the temperature coefficient of resistance and sheet resistance for different thicknesses of polysilicon.

FIG. 10A shows a two-axis line graph 260 plotting the temperature coefficient of resistance and sheet resistance for different thicknesses of polysilicon. The graph 260 includes an X-axis 262 plotting the polysilicon thickness of a gate, such as the gate 70 described previously with reference to FIG. 2. The graph 260 includes a primary Y-axis 264 plotting the TCR measured in ppm/° C. The graph 260 also includes a secondary Y-axis 266 plotting the sheet resistance measured in ohms/cm$^2$. The graph 260 includes a data series 270 plotting the TCR values measured for different polysilicon thicknesses. The data series 270 contains four data points 271, 272, 273, and 274. The graph 260 also includes a data series 280 plotting the sheet resistance values measured for different polysilicon thicknesses. The data series 280 contains four data point 281, 282, 283, and 284.

FIG. 10B shows a table 290 providing implantation parameters for the different data points in FIG. 10A. The table 290 contains four data rows 291, 292, 293 and 294. The data row 291 lists implantation parameters for the data points 271 and 281. The data row 292 lists implantation parameters for the data points 272 and 282. The data row 293 lists implantation parameters for the data points 273 and 283. The data row 294 lists implantation parameters for the data points 274 and 284.

Referring to FIGS. 10A and 10B collectively, the data series 270 in combination with the corresponding data rows from the table 290 show that as the polysilicon thickness decreases, the TCR decreases in magnitude. Note that the TCR value moving closer to zero is decreasing in terms of magnitude. For example, the data point 271 represents a polysilicon thickness of 500 Å. The data point 272 represents a polysilicon thickness of 1000 Å. Referring to the corresponding data row 291, the data point 271 has a TCR of −74.7 ppm/° C. Referring to the corresponding data row 292, the data point 272 has a TCR of −413 ppm/° C. Thus, the data point 271, representing a lower polysilicon thickness, has a lower TCR in magnitude than the data point 272. This trend continues for the data points 273 and 274, which are not specifically described here for the sake of brevity.

Again referring to FIGS. 10A and 10B collectively, the data series 280 in combination with the corresponding data rows from table 290 shows that as the implant dosage and implant energy increase, sheet resistance can remain relatively constant or increase. For example, the data point 281 in combination with the corresponding data row 291 represents an implantation energy of 30 KeV, and a BF$_2$ dose of 30×10$^{14}$ ions/cm$^2$. The data point 282 in combination with the corresponding data row 292 represents an implantation energy of 20 KeV, and a BF$_2$ dose of 17×10$^{14}$ ions/cm$^2$. The data point 281 has a sheet resistance of 1671 ohms/cm$^2$ and the data point 282 has a sheet resistance of 1013 ohms/cm$^2$. Thus, the data point 281, representing a higher implantation energy/dosage, has a higher sheet resistance than the data point 282. This trend continues for the data points 283 and 284, which are not specifically described here for the sake of brevity. This trend shows that the decrease of sheet resistance normally associated with a resistor's thickness is reversed by applying an implant process as described herein.

Thus, the embodiments of the present disclosure offer advantages over existing semiconductor manufacturing techniques, it being understood that different embodiments may offer different advantages, and that no particular advantage is required for all embodiments. One advantage is a low TCR variation for a gate thinned with the described etching process. Another advantage is a high sheet resistance for a gate doped with the described implant process. Another advantage is the lack of the traditional trade off between TCR and sheet resistance. By applying the etching process and implant process described herein, a low TCR and a high sheet resistance can be attained simultaneously. In addition, the described techniques require only one extra mask during the etching and implant steps, leading to the advantage of lower cost than other techniques known in the art.

It is understood that additional fabrication processes may be performed to complete the fabrication of the semiconductor device shown in FIGS. 2-9. For example, an interconnect structure containing a plurality of metal layers may be formed to establish electrical connections between components of the semiconductor device and external devices. Other processes such as passivation, wafer testing, wafer dicing, and packaging processes may also be performed.

One of the broader forms of the present disclosure involves a method. The method includes providing a substrate including a top surface. The method also includes forming a gate over the top surface of the substrate. The formed gate has a first height measured from the top surface of the substrate. The method also includes etching the gate to reduce the gate to a second height. This second height is substantially less than the first height.

Another one of the broader forms of the present disclosure also involves a method. The method includes providing a wafer including a top surface. The method also includes forming a first gate and a second gate over the top surface of the wafer. The method also includes performing an etching process on the first gate to reduce a height of the first gate while protecting the second gate. After this etching process, the height of the first gate is substantially less than a height of the second gate.

Another one of the broader forms of the present disclosure involves a semiconductor device. The semiconductor device includes a substrate. The substrate includes a top surface. The semiconductor device also includes a first gate formed over the top surface of the substrate. The first gate has a first height. The semiconductor device also includes a second gate formed over the top surface of the substrate. The second gate has a second height. The first height is substantially less than the second height.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   providing a substrate including a top surface;
   forming a gate and gate spacers over the top surface of the substrate, the gate and gate spacers having a first height measured from the top surface of the substrate;
   forming a patterned photoresist layer over the substrate, the photoresist layer covering portions of the substrate and exposing the gate, wherein the gate spacers have external side surfaces that are exposed at a point lower than a top of the gate; and
   etching a gate electrode and the gate spacers of the gate with the photoresist layer present to reduce the gate to a second height, the second height being about 10% to about 75% of the first height.

2. The method of claim 1, wherein the forming the gate includes forming an additional gate having a third height; and wherein after the etching the second height is substantially less than the third height.

3. The method of claim 2, further including:
   forming a resist protective oxide (RPO) layer over the gate; and
   forming a silicide layer over the additional gate.

4. The method of claim 2, wherein the gate includes a polysilicon material; and wherein the additional gate includes a material selected from polysilicon and metal.

5. The method of claim 2, further including: forming different numbers of contacts on the etched gate and the additional gate.

6. The method of claim 2, wherein the etching is carried out in a manner so that the additional gate is protected during the etching.

7. The method of claim 2, wherein the substrate includes a shallow trench isolation (STI) device and an active region; and
   wherein the gate is formed above the shallow trench isolation device and the additional gate is formed above the active region.

8. The method of claim 1, further including:
   performing an implant process on the gate;
   wherein the implant process uses $BF_2$ as a dopant and has an implantation energy level between 10 KeV and 40 KeV and a dosage between $9 \times 10^{14}$ ions/cm$^2$ and $4 \times 10^{15}$ ions/cm$^2$.

9. A method, comprising:
   providing a substrate including a top surface;
   forming a first gate and gate spacers and a second gate and gate spacers over the top surface of the wafer;
   forming a patterned photoresist layer over the substrate, the photoresist layer protecting the second gate and exposing the first gate, wherein external side surfaces of the gate spacers of the first gate are exposed and the gate spacers are a same height as the first gate; and
   performing an etching process on a gate electrode and the gate spacers of the first gate to reduce a height of the first gate while protecting the second gate.

10. The method of claim 9, wherein the etching reduces the height of the first gate to about 10% - 75% of the height of the second gate.

11. The method of claim 9, further including:
   performing an implant process on the first gate; wherein the implant process uses $BF_2$ as a dopant and has an implantation energy level between 10 KeV and 40 KeV and a dosage between $9 \times 10^{14}$ ions/cm$^2$ and $4 \times 10^{15}$ ions/cm$^2$.

12. The method of claim 9, further including: forming a resist protective oxide layer on the first gate; and forming a silicide layer on the second gate.

* * * * *